United States Patent [19]

Mihara

[11] Patent Number: 4,803,532
[45] Date of Patent: Feb. 7, 1989

[54] VERTICAL MOSFET HAVING A PROOF STRUCTURE AGAINST PUNCTURE DUE TO BREAKDOWN

[75] Inventor: Teruyoshi Mihara, Yokosuka, Japan

[73] Assignee: Nissan Motor Co., Ltd., Kanagawa, Japan

[21] Appl. No.: 18,867

[22] Filed: Feb. 25, 1987

Related U.S. Application Data

[60] Division of Ser. No. 767,628, Aug. 20, 1985, abandoned, which is a continuation-in-part of Ser. No. 865,598, May 22, 1986, Pat. No. 4,686,551, which is a continuation of Ser. No. 555,050, Nov. 25, 1983, abandoned.

[30] Foreign Application Priority Data

Nov. 27, 1982 [JP] Japan ................................ 57-208293
Aug. 24, 1984 [JP] Japan ................................ 59-176038

[51] Int. Cl.$^4$ ...................... H01L 29/78; H01L 29/06; H01L 27/02
[52] U.S. Cl. ..................................... 357/234; 357/20; 357/41; 357/88; 357/90
[58] Field of Search ..................... 357/23.4, 20, 41, 88, 357/89, 90

[56] References Cited

U.S. PATENT DOCUMENTS

| | | | |
|---|---|---|---|
| 4,345,265 | 8/1982 | Blanchard | 357/23.4 |
| 4,366,495 | 12/1982 | Goodman et al. | 357/23.4 |
| 4,514,747 | 4/1985 | Miyata et al. | 357/90 |

FOREIGN PATENT DOCUMENTS

| | | | |
|---|---|---|---|
| 51-85381 | 7/1976 | Japan | 357/23.4 |
| 57-42164 | 3/1982 | Japan | 357/23.4 |
| 57-88772 | 6/1982 | Japan | 357/23.4 |
| 58-16569 | 1/1983 | Japan | 357/23.4 |
| 58-175872 | 10/1983 | Japan | 357/23.4 |
| 58-210677 | 12/1983 | Japan | 357/23.4 |
| 59-98557 | 6/1984 | Japan | . |
| WO82/02981 | 9/1982 | PCT Int'l Appl. | 357/234 |
| 2062349 | 5/1981 | United Kingdom | 357/23.4 |
| 2082385 | 3/1982 | United Kingdom | 357/23.4 |

OTHER PUBLICATIONS

Sze., *Physics of Semiconductor Device*, 1981 p. 32.
Sun et al., "Modeling of the On-Resistance of LDMOS, VDMOS, and VMOS Power Transistors", *IEEE Trans. on Electron Devices*, vol. ED-27, Feb. 1980, pp. 356-367.
Tarng, "On-Resistance Characterization of VDMOS Power Transistors", *IEDM* 1981, 17.7, pp. 429-433.
I. Yoshida et al., "A High Power MOSFET . . . Structure", *IEEE Journal of Solid-State Circuits*, vol. SC-11, No. 4, Aug. 1976, pp. 472-477.
Severns, "MOSFETs Rise to New Levels of Power", *Electronics International*, vol. 53, No. 12, May 1980, pp. 143-152.
Tihanyi, J., "A Qualitative Study of the DC Performance of SIPMOS Transistors", Siemens Forsch v. Entwicki-Ber. Bd. 9 (1980) Nr. 4 c. Springer-Verlag 1980.
Bell, G. et al., "SIPMOS Technology, an Example of VLSI Precision . . . ", Siemens Forsch v. Entwicki-Ber. Bd. 9 (1980) Nr. 4 c. Springer-Verlag 1980.
Hexfet Databook, Chapter 5, "The HEXFET's Integral Reverse Rectifier . . . ", International Rectifier, El Segundo, California c. 1981.

*Primary Examiner*—J. Carroll
*Attorney, Agent, or Firm*—Foley & Lardner, Schwartz, Jeffery, Schwaab, Mack, Blumenthal & Evans

[57] ABSTRACT

A vertical MOSFET having a reduced drain to source resistance is described as comprising a well region which are formed with a suitable distance from a high resistivity drain substrate and in contact with a source electrode. Undesirable parasitic bipolar transistor action can be prevented.

7 Claims, 6 Drawing Sheets

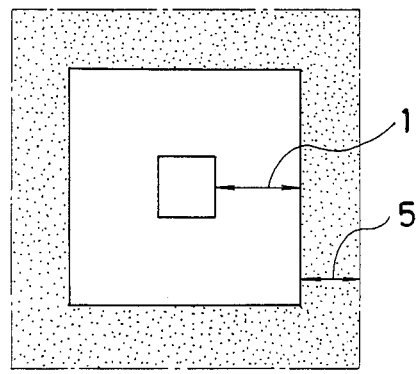
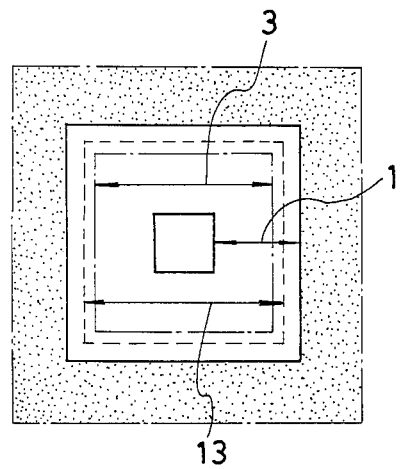

VERTICAL MOSFET HAVING A PROOF STRUCTURE AGAINST PUNCTURE DUE TO BREAKDOWN

CROSS REFERENCE TO RELATED APPLICATION

This application is a continuation of application Ser. No. 767,628, filed Aug. 20, 1985, abandoned, which is a continuation-in-part of U.S. application Ser. No. 865,598, filed May 22, 1986, U.S. Pat. No. 4,686,551, is a continuation of U.S. application Ser. No. 555,050, filed Nov. 25, 1983, now abandoned.

BACKGROUND OF THE INVENTION

The present invention relates to a vertical MOSFET which takes measures for preventing device puncture due to breakdown.

MOS structures, whose major current flow was perpendicular to the surface of the structure, have been employed mainly in the fabrication of MOS power transistor devices. Because the relative lightly doped channel is quite short between the source and drain regions of the MOS power transistor devices, substantial bipolar transistor action can be induced. In application for a switching element, the MOS transistor is possibly applied with high voltage surge during switching, incurring breakdown current which tends to be concentrated to a certain portion of the parasitic transistor and which renders the transistor to be broken.

SUMMARY OF THE INVENTION

An object of the present invention is to provide a vertical MOSFET in which the breakdown current caused by a surge or the like does not converge to a limited part within the device but flows through a rather broad part uniformly, whereby the thermal breakdown of the device is not readily incurred, and surge withstanding ability of the device is increased.

Another object of the invention is to provide a vertical MOSFET precluded from undesirable parasitic bipolar action.

Further object of the invention is to provide a vertical MOSFET having a relatively low turn-on resistance Further object of the invention is to provide a vertical MOSFET which can be used in a voltage range including the breakdown voltage.

In accordance with an aspect of the invention, a vertical MOSFET is configured so that a breakdown is to start at the bottom section of a well region in which are formed a source region and a channel region prior to that in the channel region and that the base registance of a parastic bipolar transistor is reduced to a substantial degree, obtaining an effect that an extremely large breakdown current is allowed to flow, by preventing the secondary breakdown which is based on the parasitic transistor mode.

BRIEF DESCRIPTION OF THE DRAWINGS

FIGS. 8(A) and 8(B) are the diagrams for comparing the cell patterns of the MOSFETs due to the prior art and the present invention.

DETAILED DESCRIPTION OF THE PREFERRED EMBODIMENT

To facilitate the understanding of the present invention, a conventional vertical MOSFET will be briefly discussd.

The prior art vertical MOSFETs include, for example, the device that is set forth in HEXFET Databook, pp. 6–11 published by IR company in 1981.

Figure 1:
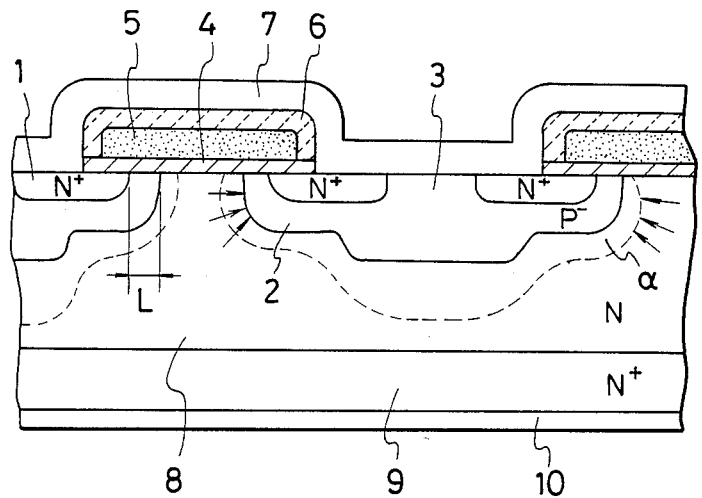
FIG. 1 is a cross-section view of a prior art verticl MOSFET device.

The device comprises, as shown by FIG. 1, a semiconductor base body consisting of an N+ type substrate 9 whose bottom side is joined to a drain electrode 10 and an N− type drain region 8 on the top side, a plurality of P− type channel regions 2 formed in the base body with a fixed distance apart, a source region 1 formed within the channel region 2, a gate electrode 5 formed on the top surface side of the base body stretching over the source region 1 and the drain region 8, a SiO$_2$ film for the gate 4, a layer insulation film 6, and a source electrode 7. In the figure, the depletion layer d is defined by the broken line.

However, in a prior art vertical MOSFET like in the above, when there is impressed a high voltage between the drain and the source, electric fields will concentrate in the corner area of the channel region 2 which is directly beneath the gate electrode 5, as shown by the arrows in the figure. A breakdown which starts here tends to induce a current concentration based on the parasitic bipolar action so that there exists a problem,- that the device puncture takes place easily.

The above phenomenon will be described in more detail by referring to FIGS. 2 and 3. In a vertical MOSFET with the above consruction which may be represented by an equivalent circuit as shown by FIG. 3, the corner area corresponds to a parasitic transistor 12 with N− P− N+ structure, and hence the breakdown voltage for the corner corresponds to the BV$_{CER}$ (withstand voltage between the collector and the emitter) of the parasitic transistor. Here, it will be seen from FIG. 3 that the base resistance R is given by R=R$_{B1}$+R$_{B2}$+R$_{B3}$.

The breakdown current generated between the collector C and the base B (P-N junction) of the parasitic transistor 12 flows to the source S through R$_{B1}$→R$_{B2}$→R$_{B3}$. If the base current I$_B$ grows large enough to satisfy $$I_B R = I_B (R_{B1} + R_{B2} + R_{B3}) \geq 0.6 \ V, \tag{1}$$

there will flow a base current due to the forward bias between E and B of the parasitic transistor 12. The parasitic transistor 12 will be subjected to a rapid positive feedback in the current concentration resulting from the current flow causing an increase in heating which causes an even greater current flow with larger current (due to the negative temperature coefficient of $V_{BE}$ of the transistor), leading to a secondary breakdown.

The well region 3 in FIG. 1 is aimed at improving the withstand voltage for Drain-Source by controlling the extension of the depletion layer (to tend to extend downward) as well as at improving the withstand voltage in the secondary breakdown, by reducing $R_{B2}$ and $R_{B3}$ that constitute a part of the base resistance R of the parasitic transistor 12 in FIG. 3. As to a portion of the channel region 2 (corresponding to $R_{B1}$), it had to be left there as it is for the purpose of determining te threshold voltage Vth and the channel length L.

In this way, according to the prior art, it was not possible to let a large breakdown current flow even for a short time, because of the small value of the withstand voltage for secondary breakdown due to the two reasons that the breakdown starts at the corner in the channel region 2 and that the resistance $R_{B1}$ may not be reduced markedly, as mentioned above.

Because of this, in the actual use of the device for switching of an inductive load such as motor or solenoid, it has been necessary to provide a protective measure, for instance, by adding a capacitor or a Zener diode between D and S for absorbing the surge that is generated at the time of switching off.

Figure 4:
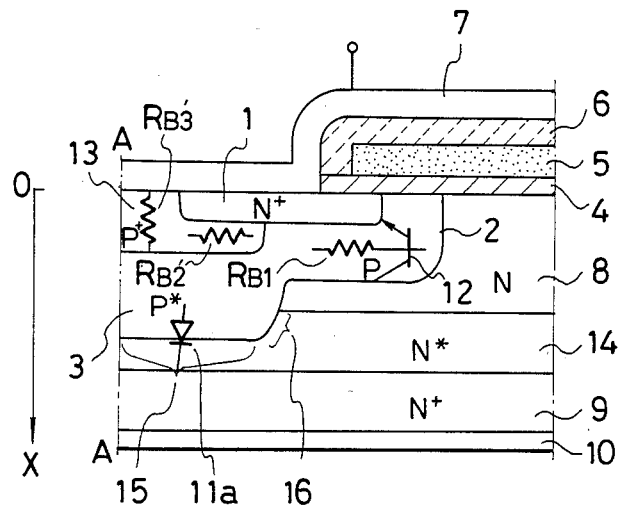
FIG. 4 illustrates a cross-section view of a vertical MOSFET device in accordance with the present invention.
Figure 5:
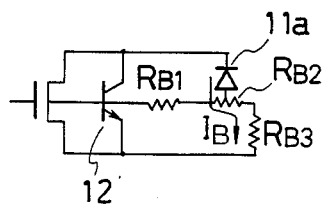
FIG. 5 is an equivalent circuit diagram for the device.

Illustrated in FIG. 4 is an embodiment of the present invention. The embodiment may be represented by an equivalent circuit as shown by FIG. 5. In the figure, the well region 3 is formed by diffusion after implantation of boron ions to the surface of the drain region 8. At the same time there occured a diffusion from a highly doped substrate 9 toward the drain region 8, forming a redistributed layer 14 of impurities.

The redistributed layer forms a P-N junction which determines in effect the withstand voltage between the well region 3 and the substrate 9.

The well region 3 is extended even to the area beneath the source region 1 in order to handle the current by large area. However, case is being taken for the well region not to reach to the area directly below the gate electrode 5 (namely, the channel region).

Figure 6:
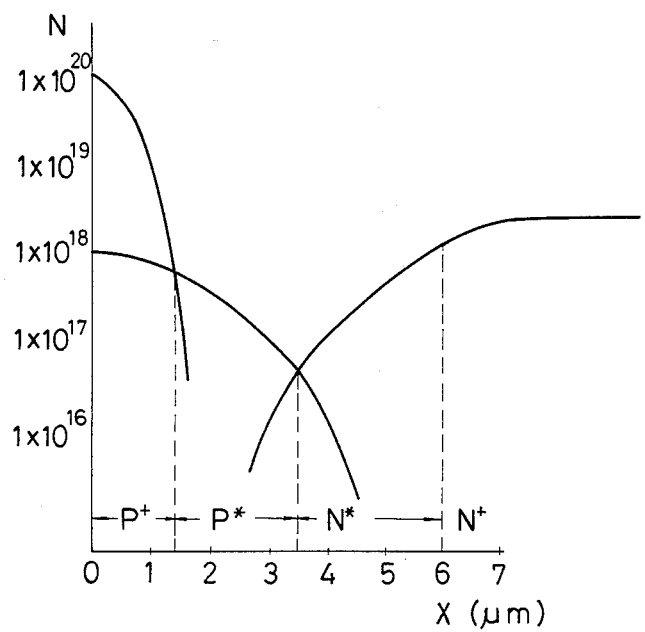
FIG. 6 is a diagram representing the graph which shows the inpurity concentration profiles of the element.
Figure 7A:
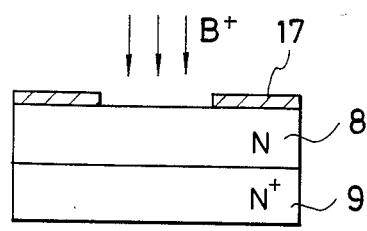
FIGS. 7(A) to 7(G) are the process diagrams for illustrating the manufacturing method.
Figure 7E:
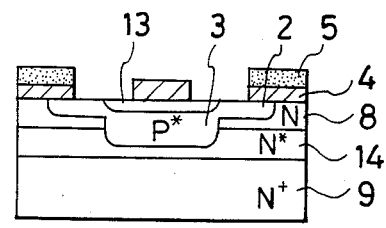
Figure 7B:
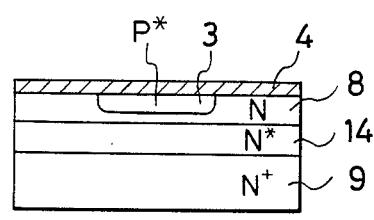
Figure 7F:
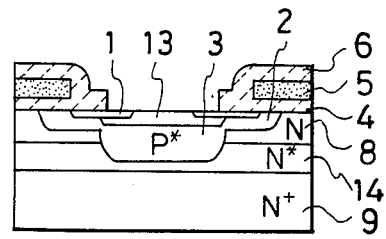
Figure 7C:
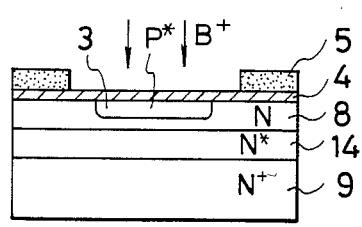
Figure 7G:
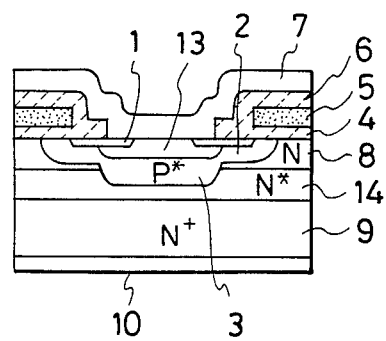
Figure 7D:
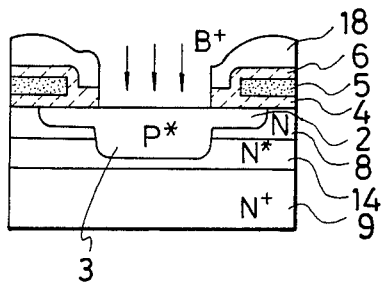

Similary, stretched below the source region 1 there is provided a highly doped well region 13 to reduce the base resistance. In FIG. 6 is shown the profile of impurity concentrations in the vertical direction as seen along A—A of FIG. 4. The remaining construction is the same as for the first- embodiment.

Next, an example of concrete manufacturing conditions will be described by referr.ing to FIGS. 7(A) to 7(G).

(A) First, on an antimony-dopted N-type substrate 9 with specific resistance 0.015 Ωcm and thickness 380 μm, there is grown a drain region 8 (0.3–0.5 Ωcm, 6–7 μm) by the epitaxial growth method. Then, after growing a thermally oxidized layer 17 for a thickness of 7000 Å by thermal oxidation (1100° C., 75 min, wet), prescribed region is photo-etched, and boron ions (B+) are implanted (60 keV, $1 \times 10^{14}$ cm$^{-2}$) in preparation for the formation of a well region 3.

(B) Next, the ion-implanted layer is prediffused (1200° C., 60 min). In this stage, a redistributed layer 14 and a well region 3 are formed with simultaneous redistribution diffusion from the substrate 9 into the drain region 8. At this point in time, however, the well region 3 and the redistributed layer 14 are not connected yet. Then, the thermally oxidized layer formed during the diffusion is removed, and a clean oxidized layer 4 for the gate is grown (1050° C., 91 min, ion cry O$_2$) to a thickness of 1000–1100 Å at a prescribed region.

(C) The, a gate electrode 4 consisting of polysiliconis grown byCVD, an after photo-etching it to a prescribed (for instance, a mesh) form, B+ ions are implanted (60 keV, $1 \times 10^{14}$ cm$^{-2}$) using the gate electrode 5 as a masking, to form a channel region.

(D) Next, the ion-implanted layer is diffused (1200° C. 200 min) to form a channel region 2, and at the same time,diffusion in the well region 3 and in the redistributed layer 14 is allowed to proceed further to produce a junction between the two layers. Following that, B+ ions are implanted (60 keV, $5 \times 10^{15}$ cm$^{-2}$) into the section where a highly doped well region 13 is to be formed, with the resist 18 as a masking.

(E) Then, B+ ions that are implanted in the preceeding process is diffused (1080° C., 45 min). During this period, a thermally oxidized layer which will serve as a masking in the next process is also grown (1000–1500 Å).

With the steps up to this stage, the impurity profiles in the present invention are fixed for the most part.

Namely, the diffusion depth for the highly doped well region 13 is about 1.5 μm, the diffusion depth Xj(p) of the well r egion 3 is between 3.5 μm and 4 μm, the diffusion depth Xj(p) of the channel region 2 is about 3 μm, and the extent Xj(n) of the redistributed layer 14 is about 3 μm.

Moreover, the lateral diffusion length of the channel region 2 beneath the gate electrode 5 is about 2.5 μm. Typical concentration distributions in the vertical direction are as shown in FIG. 6.

What is important to be noted here is that the redistributed layer 14 should not encroach upon the channel region 2, though it should make a contact with the well region 3. The reason for this is that an encroachment of the redistributed layer 14 upon the channel region 2 will results in an inability to control the threshold voltage and the undersirable phenomenon of punch-through (this happens when the width of the channel region, that is, the separation between the source and the drain, becomes small).

A wafer which is profile-controlled as in the foregoing is then removed of the thermally oxidized film by photo-etching, except for a portion (contact) of the highly doped well region 13, for a source diffusion which will take place next. An implantation is then carried out by the use of an N-type diffusion source such as P$_o$Cl$_3$, with the gate electrode 5 (polysilicon) as a masking, to form a source region 1.

The source region 1 typically possesses a sheet resistance of 10 to 20Ω per sheet and a diffusion depth of 1 μm.

The channel length of the vertical MOSFET is controlled by the lateral diffusion of the channel region 2 and the lateral diffusion (e.g., 0.8 μm) of the source region [the so-called DSA (diffusion self alignment) technique].

(F) Next, after deposition (to 7000 Å) of a layer insulation film 6 such as phosphorus glass (PSG) by CVD method or the like, a prescribed section is photo-etched for connection of an electrode to the source region 1 and the well region 3.

(G) Finally, a drain electrode 10 and a source electrode 7, of aluminum, are deposited (to a thickness of about 2 μm), completing the manufacture of a vertical MOSFET of the present invention.

Next, the operation of the device will be described. In a vertical MOSFET in accordance with the present invention, the withstand voltage between the drain and the source is determined by the junction between the well region 3 and the redistibuted layer 14. As may be guessed from the impurity concentration profiles shown in FIG. 6, the junction is of graded type, with the withstand voltage given by $$BV = \sqrt{32\epsilon_s \epsilon_{crit}^3 / 9q\alpha} \quad (2)$$

In the above expression, $\epsilon_s$ is the permittivity of silicon, $\epsilon_{crit}$ is the electric field strength at breakdown, q is the charge on the electron, and $\alpha$ is the gradient of the impurity concentration.

It should be noted that Eq.(2) is cited from Grove, "Physics and Technology of Semiconductor Devices", John Wiley & Sons.

As may be clear from Eq.(2), the withstand voltage can be controlled by controlling the value of $\alpha$. The value for $\alpha$ depends upon the diffusion conditions (amount of implantation and diffusion time), the epitaxial thickness, and so forth.

Figure 2:
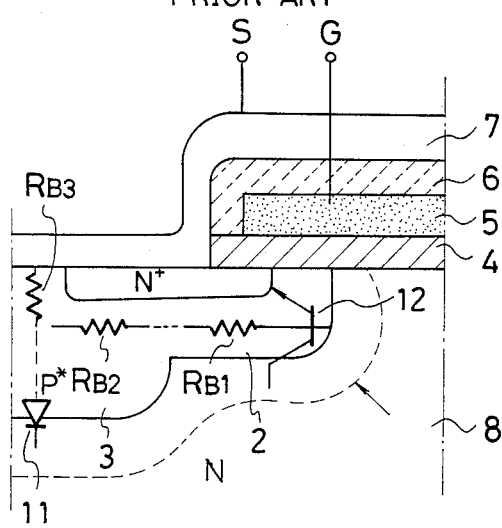
FIG. 2 is an enlarged diagram of the principal part of the vertical MOSFET shown in FIG. 1.
Figure 3:
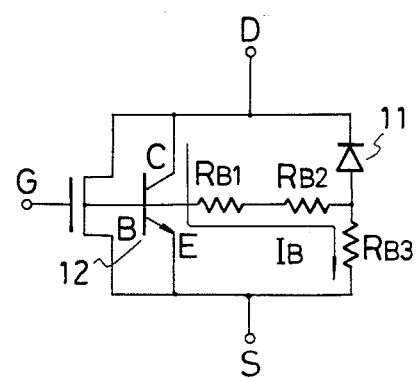
FIG. 3 is an equivalent circuit diagram for the vertical MOSFET shown in FIG. 1.

For a device with profiles as shown by FIG. 2, one obtains $\alpha = 2 \times 10^{21}$ cm$^{-4}$ so that BV becomes about 30 V. At the corner area of the well region 3, $\alpha$ obviously decreases and hence the withstand voltage becomes less than the above value. In this case, the withstand voltage in the corner area of the channel region 2 is about 50 V so that there will occur no breakdown.

Describing the above in more detail by referring to FIGS. 4 and 5, in the present invention, when the drain voltage reaches 30 V, there will occur a breakdown over a wide area in the bottom section of the well region (namely, in the parastic diode 11a), with flow of a current toward the source electrode 7. This current flows only through lower resistance components $R_{B2'}$ and $R_{B3'}$ in the base resistance due to enriched well region 13 without flowing through the highest resistance component $R_{B1}$.

The condition for turning on the parasitic transistor 12 is given by $$I_B (R_{B2'} + R_{B3'}) \geq 0.6 \, V. \quad (3)$$

By comparing the above with the condition for turning on the prior art device, Eq. (1), it will be seen that a secondary breakdown is obviously less easy to occur for a device embodying the present invention, even for flow of a large current, since there holds a relation $R_{B2'} + R_{B3'} << R_{B1} + R_{B2} + R_{B3}$.

Figure 9:
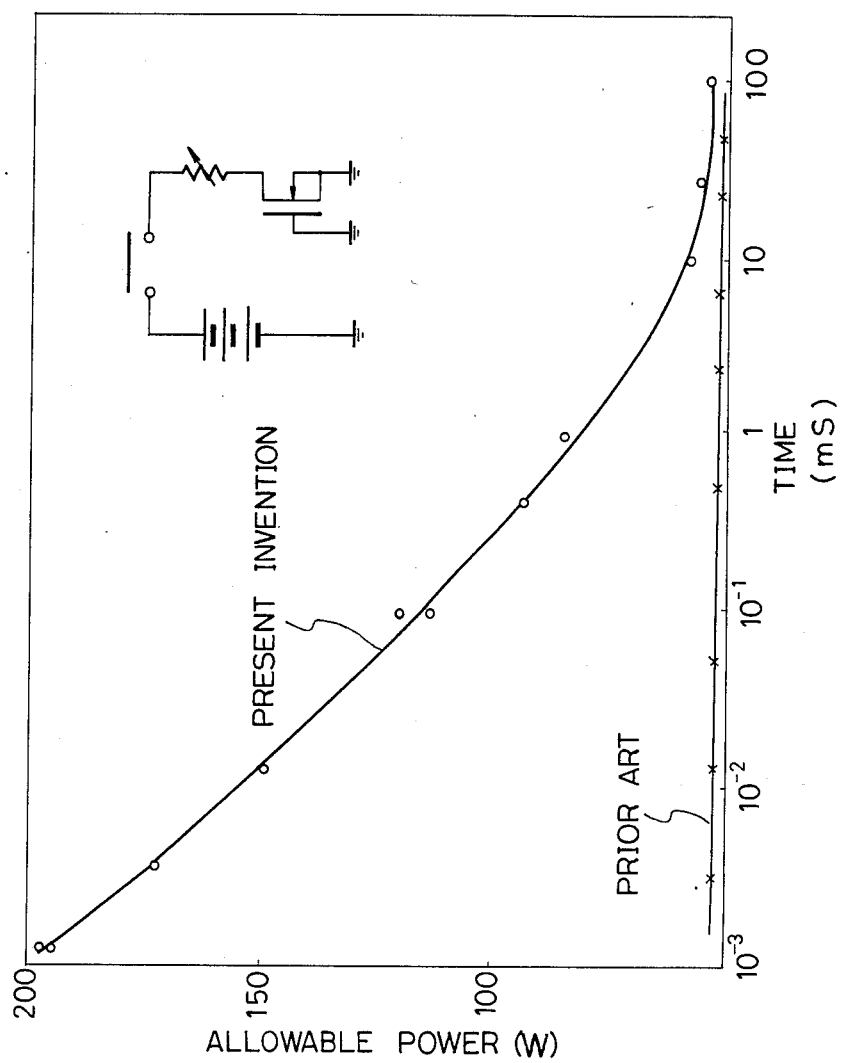
FIG. 9 is a diagram for illustrating the results of test on the withstand voltage at breakdown.

In FIG. 9 there are compared the result of the breakdown test for a vertical MOSFET in accordance with the present invention and a prior art device. The samples used for the test are chips consisting of 1000 cells designed for identical cell size. The cell patterns are shown in FIGS. 8(A) and 8(B), where FIG. 8(A) is for the prior art device and FIG. 8(B) is for the device due to the present invention. The difference in the manufacturing conditions are that the drain region 8 is given a large extension of 10 μm and that there is not provided a highly doped well region 13 for the prior art device. (The S-D withstand voltage of about 60 V is slightly higher than for the present device.)

As may be seen from FIG. 9, it is clear in the present invention that there is indicated the presence of an area of safe operation (ASO) for pulse which is limited by heat radiation and that for a small value of the time it is possible to allow the flow of a considerably large current compared with the prior art device. (In the prior art device, the ASO for pulse is very narrow because it is controlled by the secondary breakdown.)

Figure 10:
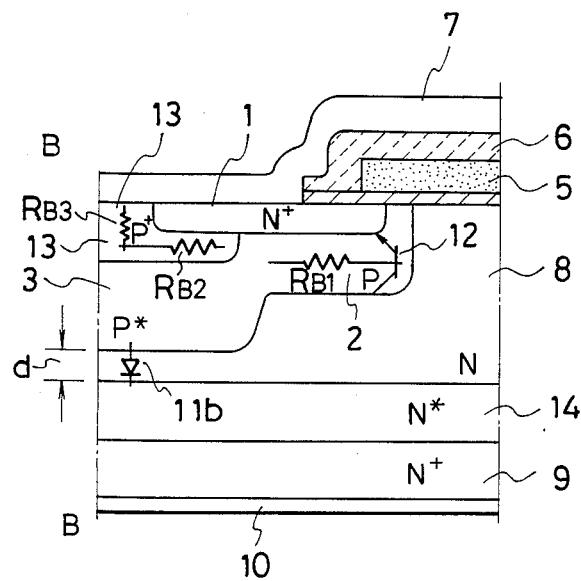
FIG. 10 is a cross-section view for a second embodiment of the present invention.
Figure 11:
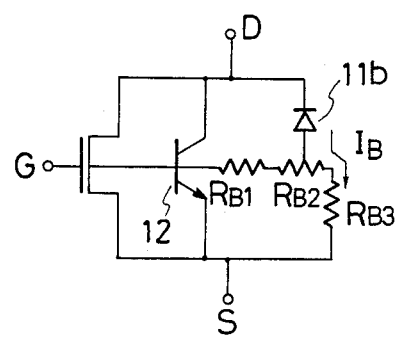
FIG. 11 is an equivalent circuit diagram for the embodiment.

In FIGS. 10 and 11 are shown another embodiment of the present invention and an equivalent circuit thereof. Analogous to the first embodiment, this embodiment is arranged to start a uniform breakdown over a wide area in the bottom section of the well region 3. This example is characterized further by the fact that the so-called reach-through breakdown is arranged to be induced by preventing the extension of the depletion layer to the drain region 8 which is directly below the well region 3 by the redistibuted layer 14.

In the figure, by choosing the separation d between the well region 3 and the redistributed layer 14 and the impurity concentration in the drain region 8 so as to have a reach-through breakdown in the bottom section of the well region 3 ahead of the breakdown in the collector base (that is, the corner area of the channel region 2) of the parasitic transistor 12, the breakdown current flows from the well region 3 to the source electrode 7 through the low resistances $R_{B2}$ and $R_{B3}$ in the highly doped well region 13, without flowing through the channel region 2 which has a higher value of resistance $R_{B1}$. Therefore, same effects as in the first embodiment can be expected.

As understood from the above description, in the present invention no current flows through $R_{B1}$ so that there is obtained an excellent effect that a channel length may be decreased and the turn-on resistance can be lowered. Also according to the invention breakdown will not destroy the device but rather causes it to operate as a zener diode. Thereby it can be used in a voltage range including the breakdown voltage Various modifications will become possible for those skilled in the art after receiving the teachings of the present desclosure without departing from the scope thereof.

What is claimed is:

1. An MOS transistor comprising:
   a drain region having a low resistivity region of a first conductivity type, a redistributed region of said first conductivity type above said low resistivity region, and a high resistivity region of the first conductivity type above said redistributed region;
   a well region of a second conductivity type having a first well portion with a curved section in contact with said high resistivity region and having a second well portion, said second well portion and being narrower than said first well portion, said second well portion extending below said first well portion into contact with said redistributed region;
   a channel region of the second conductivity type contained in said first well portion;
   a source region of the first conductivity type adjacent to the channel region of said well region;
   a gate electrode formed above the channel region on an insulator layer;

a source electrode formed in contact with the source region and in contact with the upper surface of the second well portion of the well region, and a drain electrode formed on the bottom surface of the low resistivity region.

2. The MOS transistor of claim 1, wherein said drain region comprises a drain substrate and an epitaxial layer on said drain substrate, said redistributed layer being diffused from the drain substrate into said epitaxial layer.

3. The MOS transistor of claim 1, wherein said first well portion has a lower surface above said redistributed region.

4. The MOS transistor of claim 1, wherein said contact of said second well portion and said source electrode is made through a low resistivity contact portion of said second well portion.

5. The MOS transistor of claim 4, wherein said contact portion extends below said source region.

6. The MOS transistor of claim 5, wherein said contact portion is elongated laterally along a bottom surface of said source region.

7. An MOS transistor comprising:

a drain region having a low resistivity region of a first conductivity type, a redistributed region of said first conductivity type above said low resistivity region and a high resistivity region of the first conducitivty typ above said redistributed region, said redistributed region having an upper surface;

a well region of a second conductivity type having a portion extending into a portion of said redistributed region, said portion of said well region having an upper surface and having a wide lower surface below said upper surface of said redistributed region, said resistivity of said portion of said well region being approximately the same as that of said portion of said redistributed region;

a channel region of the second conductivity type contained in said well region;

a source region of the first conductivity type adjacent to the channel region;

a gate electrode formed above the channel region on an insulator layer;

a source electrode formed in contact with the source region and the upper surface of said portion of the well region, and a drain electrode formed on a bottom surface of the low resistivity region.

* * * * *